United States Patent
Posseme

(10) Patent No.: US 10,446,408 B2
(45) Date of Patent: Oct. 15, 2019

(54) PROCESS FOR ETCHING A SIN-BASED LAYER

(71) Applicant: COMISSARIAT A L'ENERGIE ATOMIQUE ET AUX ENERGIES ALTERNATIVES, Paris (FR)

(72) Inventor: Nicolas Posseme, Sassenage (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 15/961,338

(22) Filed: Apr. 24, 2018

(65) Prior Publication Data

US 2018/0315614 A1 Nov. 1, 2018

(30) Foreign Application Priority Data

Apr. 25, 2017 (FR) ..................... 17 53542

(51) Int. Cl.
*H01L 21/311* (2006.01)
*H01L 21/8238* (2006.01)
(Continued)

(52) U.S. Cl.
CPC .. *H01L 21/31116* (2013.01); *H01L 21/31155* (2013.01); *H01L 21/823864* (2013.01);
(Continued)

(58) Field of Classification Search
CPC .. H01L 21/31116; H01L 27/092; H01L 29/66; H01L 21/31155; H01L 21/84;
(Continued)

(56) References Cited

U.S. PATENT DOCUMENTS 6,635,938 B1* 10/2003 Nakahata ........ H01L 21/823418
257/382
9,570,317 B2* 2/2017 Posseme ............... H01L 21/306
(Continued)

FOREIGN PATENT DOCUMENTS

EP 2 750 170 A1 7/2014
EP 2 999 001 A2 3/2016

OTHER PUBLICATIONS

French Preliminary Search Report dated Jan. 9, 2018 in French Application 17 53542 filed on Apr. 25, 2017 (with English Translation of Categories of Cited Documents and Written Opinion).

*Primary Examiner* — Duy Vu N Deo
(74) *Attorney, Agent, or Firm* — Oblon, McClelland, Maier & Neustadt, L.L.P.

(57) ABSTRACT

A microelectronic method for etching a layer containing silicon nitride is provided, including the following successive steps: modifying the layer containing silicon nitride (SiN) so as to form at least one modified zone, the modifying including at least one implantation of ions made from hydrogen (H) in the layer containing SiN; and removing the at least one modified zone, the removing of the at least one modified zone including at least one step of etching of the at least one modified zone using a chemistry including at least: at least one compound chosen from the fluorocarbon compounds ($C_xF_z$) and the hydrofluorocarbon compounds ($C_xH_yF_z$), and at least one compound chosen from $Si_wCl(2_w+2)$ and $Si_wF(2_w+2)$.

18 Claims, 5 Drawing Sheets

(51) Int. Cl.
*H01L 21/84* (2006.01)
*H01L 21/3115* (2006.01)
*H01L 29/66* (2006.01)
*H01L 27/092* (2006.01)
*H01L 29/786* (2006.01)

(52) U.S. Cl.
CPC ............ *H01L 21/84* (2013.01); *H01L 27/092* (2013.01); *H01L 29/66* (2013.01); *H01L 29/66742* (2013.01); *H01L 29/66772* (2013.01); *H01L 29/78618* (2013.01); *H01L 29/78654* (2013.01); *H01L 29/78684* (2013.01); *H01L 21/823807* (2013.01); *H01L 21/823814* (2013.01)

(58) Field of Classification Search
CPC ..... H01L 21/823864; H01L 21/823807; H01L 21/823814
See application file for complete search history.

(56) References Cited

U.S. PATENT DOCUMENTS

| | | |
|---|---|---|
| 2013/0157470 A1 | 6/2013 | Watanabe et al. |
| 2014/0187046 A1* | 7/2014 | Posseme ............. H01L 21/0217 438/696 |
| 2014/0220785 A1 | 8/2014 | Watanabe et al. |
| 2016/0079388 A1 | 3/2016 | Arvet et al. |
| 2016/0300709 A1 | 10/2016 | Posseme et al. |

* cited by examiner

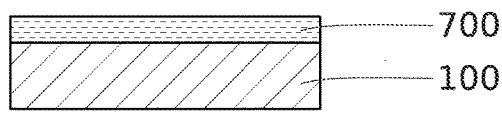
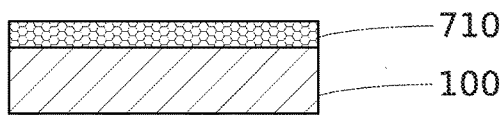
FIG. 1a    FIG. 1b
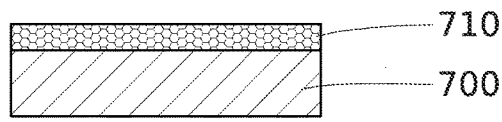
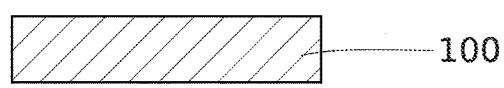
FIG. 1c    FIG. 1d
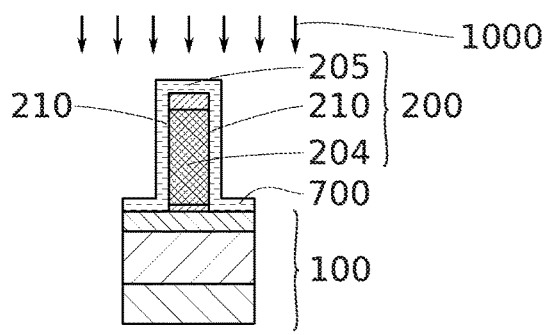
FIG. 2a
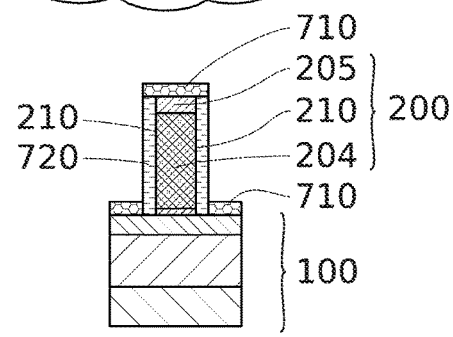
FIG. 2b

PROCESS FOR ETCHING A SiN-BASED LAYER

TECHNICAL FIELD OF THE INVENTION

The present invention relates in general to the techniques of etching a layer containing silicon nitride. It has a particularly advantageous but non-limiting use in the manufacturing, on the same substrate, of transistors having spacers containing silicon nitride and different characteristics, for example n-type or p-type doping or gate oxides having different thicknesses. It has an advantageous use in the manufacturing of such transistors on an FDSOI substrate.

PRIOR ART

Layers containing silicon nitride are widely used in numerous microelectronics devices and methods. In particular, this is the case for the manufacturing of gate spacers of transistors. One difficulty involves selectively etching the layer of silicon nitride in certain zones, typically outside of the sides of the gate, while preserving a thickness of silicon nitride in other zones, typically on the sides of the gate.

Indeed, during the etching of the silicon nitride, the current methods often lead to the incomplete etching of the layer of silicon nitride (this is called "under etching") or the unintentional etching of the underlying layer of silicon (this is called "over etching"), typically forming a channel for the transistor. Moreover, it is also difficult to selectively etch the silicon nitride with respect to the neighbouring layer of silicon oxide forming isolation trenches (usually called Shallow Trench Isolation (STI)) isolating the transistors, This unintentional consumption of silicon or of silicon oxide leads to significant deterioration of the performance of the transistor.

Numerous solutions were researched in order to improve the selectivity of the etching of the layers containing silicon nitride with respect to the layers of silicon and of silicon oxide.

The various known solutions, inevitably lead to an often uncontrolled consumption of the underlying layers or to incomplete etching of the layer of silicon nitride.

There is therefore a need to propose a solution for improving the selectivity of the etching of the silicon nitride with respect to the silicon and the silicon oxide.

This set of problems is even more important when transistors having different characteristics, for example n-type transistors and p-type transistors, must be manufactured on the same substrate and etching must take place on the transistors of one of these types while the transistors of the other type are already formed and are no longer protected.

The other objects, features and advantages of the present invention will be clear upon examination of the following description and the accompanying drawings. It is understood that other advantages can be incorporated.

SUMMARY OF THE INVENTION

According to a first embodiment, the invention relates to a microelectronic method for etching a layer containing silicon nitride, comprising the following successive steps:
  modifying the layer containing silicon nitride (SIN) in such a way as to form at least one modified zone, the modification involving at least one implantation, preferably via plasma, of light ions in the layer containing SiN;
  removing the at least one modified zone;

The removal of the at least one modified zone comprises at least one step of etching, preferably via plasma, of the at least one modified zone using a chemistry comprising at least:
  at least one compound chosen from the fluorocarbon compounds ($C_xF_z$) and the hydrofluorocarbon compounds ($C_xH_yF_z$), and
  at least one compound chosen from $Si_wCl(2_w+2)$ and $Si_wF(2_w+2)$.

Preferably, x, y, z and w are integers. Preferably, w=1 or w=2.

It has been noted that, in a particularly advantageous and unexpected manner, the method according to the present invention allows the layer containing SiN to be etched effectively without consuming other materials such as silicon or silicon dioxide. Moreover, this etching chemistry is particularly selective in the non-modified zones and portions of the layer containing SiN.

The invention thus allows the dimensional control to be considerably improved while not altering the underlying or neighbouring layers made of semiconductor or dielectric materials. The microelectronic devices manufactured according to the present invention thus have improved performance.

A step of etching, via plasma, the at least one modified zone using a chemistry comprising at least at least one compound chosen from $Si_wCl(2_w+2)$ in addition to the compound comprising to the at least $C_xF_z$ or $C_xH_yF_z$ provides particularly effective results in terms of etching selectivity.

Moreover, the invention is particularly effective for manufacturing, on the same substrate, transistors having different characteristics, for example n-type transistors and p-type transistors. With the known methods, a very complicated step involves carrying out anisotropic etching on a layer of SiN covering the transistors of only one of these types while the transistors of the other type are already formed and are no longer protected by the layer of SiN. The known solutions often lead to the alteration of the layers of the transistors that are no longer protected or to the degradation of the semiconductor layer or the insulating layer.

It should be noted that all the steps of this method act with synergy in order to allow particularly precise and selective etching of the modified zones of the layer containing SiN with respect to the non-modified zones of this layer, with respect to the layer made of a semiconductor material such as silicon or germanium, and with respect to the insulating layer made for example from an oxide of silicon.

The association of a chemistry based on FC and SiCl4 would not allow the layer containing SiN to be etched effectively.

Moreover, the use of a fluorocarbon chemistry on zones modified by implantation of hydrogen would lead to a much lesser selectivity.

In order to improve the selectivity of the etching of a layer containing SiN, a person skilled in the art would optionally plan to use a solution containing hydrofluoric acid (HF) and would attempt to modify the parameters of this etching. At best, a person skilled in the art would use hydrofluoric acid in vapour form. Optionally, a person skilled in the art would modify the pH of the hydrofluoric acid in order to improve the selectivity.

In no way would a person skilled in the art arrive in an obvious manner at the method claimed.

BRIEF DESCRIPTION OF THE DRAWINGS

The goals, objects and the features and advantages of the invention will be clearer from the detailed description of embodiments of the invention that are illustrated by the following accompanying drawings in which:

FIG. 1a to 1d illustrate steps of an embodiment of the method according to the invention applied to a layer containing silicon nitride deposited on a flat substrate.

FIGS. 2a to 2b illustrate steps of an embodiment of the method according to the invention applied to a layer containing silicon nitride deposited on a pattern, the pattern forming, in this non-limiting example, a gate stack of a transistor.

Figure 3A:
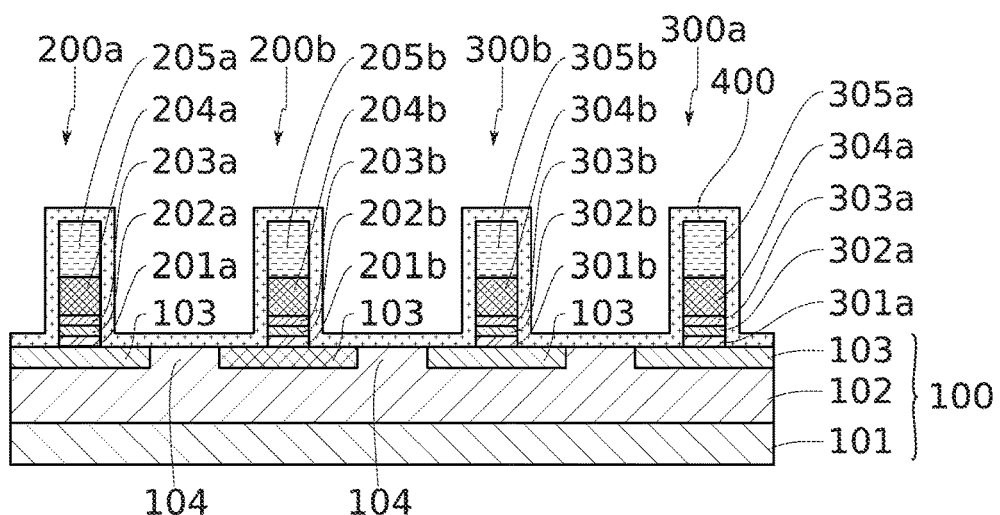
FIGS. 3a to 3h illustrate steps of an embodiment of the method according to the invention applied to a substrate on which a plurality of patterns are formed, the patterns forming, in this non-limiting example, gate stacks of a transistor.

The drawings are given as examples and are not limiting to the invention. They are schematic representations of a principle, intended to facilitate the understanding of the invention, and are not necessarily on the scale of the practical applications. In particular, the relative thicknesses of the various layers are not representative of reality.

DETAILED DESCRIPTION OF THE INVENTION

It is specified that in the context of the present invention, the terms "on", "is on top of", "covers" and "underlying" and their equivalents do not necessarily mean "in contact with." Thus, for example, the deposition of a first layer on a second layer does not necessarily mean that the two layers are directly in contact with each other, but this means that the first layer at least partly covers the second layer while either being directly in contact with it or being separated from it by at least one other layer or at least one other element.

Moreover, a layer can be composed of a plurality of sublayers made of the same material or of different materials.

In the following description, the thicknesses are generally measured in directions perpendicular to the plane of the lower face of the layer containing silicon nitride or of a substrate on which the lower layer is deposited. Thus, the thicknesses are generally taken in a vertical direction, corresponding to the axis z in the reference frame shown in FIG. 3e. However, the thickness of a layer covering a side of a pattern is taken in a direction perpendicular to this side. Thus, if the side is vertical, the thickness is then taken in a horizontal direction, corresponding to the axis x of the reference frame shown in FIG. 3e.

In the context of the present invention, resin means an organic or organo-mineral material that can be shaped by being exposed to a beam of electrons, of photons or of X-rays or mechanically.

The use of the singular for certain elements of the invention does not necessarily mean that a given element is present only once in the invention. The word "one" does not therefore exclusively mean "a single", unless otherwise specified.

In the present invention, types of doping are indicated. This doping forms non-limiting examples. The invention coves all the embodiments in which the doping is reversed. Thus, if an example of an embodiment mentions p-type doping for a first zone and n-type doping for a second zone, the present description thus describes, at least implicitly, the reverse example in which the first zone has n-type doping and the second zone has p-type doping.

Conventionally, p-type doping is doping with positive charges. Typically, the concentration of doping species is greater than or equal to 1 atom of the doping species for less than 1000 atoms of semiconductor and preferably for less than 10 to 100 atoms of the material forming the semiconductor layer. Likewise, n-type doping is doping with negative charges. Typically, the concentration of doping species is greater than or equal to 1 atom of the doping species for less than 1000 atoms of semiconductor and preferably for less than 10 to 100 atoms of the material forming the semiconductor layer.

In the present patent application, doping noted as p-type covers all the doping with carriers of positive charges, regardless of the concentration of the doping. Thus, p-type doping includes the p+ doping concentrations and the p-type doping concentrations lower than p+ doping. Likewise, doping noted as n-type covers all the doping with carriers of negative charges, regardless of the concentration of the doping. Thus, n-type doping includes the n+ doping concentrations and the n-type doping concentrations lower than n+ doping.

A substrate, a film or a layer "containing" a material A means a substrate, a film or a layer comprising this material A and optionally other materials, for example doping elements.

The word "dielectric" means a material having electric conductivity that is sufficiently low in the given use in order to be used as an insulant.

In the context of the present invention, the dielectric constant of a layer is measured for example by the conventional method called mercury drop method.

Before starting a detailed review of embodiments of the invention, optional features that can optionally be used in combination or alternatively are mentioned below.

According to one embodiment, the step of etching, via plasma, of the at least one modified zone is carried out using chemistry comprising exclusively:
  at least one compound chosen from the fluorocarbon compounds ($C_xF_z$) and the hydrofluorocarbon compounds ($C_xH_yF_z$), and
  at least one compound chosen from $Si_wCl(2_w+2)$ and $SiwF(2_w+2)$.

According to one embodiment, the layer containing SiN is formed at a temperature greater than or equal to 500° C. and preferably greater than or equal to 550° C.

It turns out that the method according to the invention is particularly advantageous when the layer containing silicon nitride has been deposited at a temperature greater than 500° C. and preferably greater than 550° C. Indeed, with this deposition temperature, a fluorocarbon chemistry to which SiCl4 or SiF4 has been added does not allow the layer of silicon nitride to be etched.

According to one embodiment, the layer containing SiN is on top of, preferably while being in contact with, a layer made from a material chosen from:
  a semiconductor material, preferably chosen from silicon (Si), germanium (Ge) and an alloy of silicon and of germanium (SiGe),
  an oxide of silicon (SiOx).

According to one embodiment, the implantation is carried out in such a way that the ions implanted are distributed in an uninterrupted manner from the surface of the layer containing SiN and over a depth less than or equal to the thickness of the layer containing SiN, the thickness being taken in a main direction of implantation.

According to one embodiment, the parameters of the implantation, in particular the energy, the duration and the dose of the implantation, are chosen in such a way that the at least one modified zone extends over a depth less than or equal to the thickness of the layer containing SiN, the thickness being taken in a main direction (z) of implantation.

Thus, a portion of the thickness of the layer of silicon nitride is not modified during the implantation. After the removal step, in the modified zones, only a portion of the thickness of the layer of silicon nitride is thus etched.

According to an alternative embodiment, the parameters of the implantation, in particular the energy, the duration and the dose of the implantation, are chosen in such a way that the at least one modified zone extends over a depth greater than or equal to the thickness of the layer containing SiN, the thickness being taken in a main direction (z) of implantation.

Thus, the entire thickness of the layer containing silicon nitride is modified during the implantation. After the removal step, in the at least one modified zone, the entire thickness of the layer of silicon nitride is thus etched.

According to one embodiment, the depth over which the implantation is carried out is between 1 nm and 30 nm and preferably between 1 nm and 10 nm.

According to one embodiment, the modification of the layer containing SiN is carried out over a depth extending from a surface of the layer containing SiN and up to at least a portion of the thickness of the layer containing SiN.

The light ions are ions made from helium (He) and/or ions made from hydrogen (H).

The ions made from hydrogen (H), are preferably chosen from the following ions: H, $H^+$, $H_2^+$, $H_3^+$.

Advantageously, the ions made from hydrogen reduce the risks of sputtering and thus of etching of the layer of SiN. Better control of the depth of implantation is therefore obtained.

According to one embodiment, said step of etching the at least one modified zone is a step of plasma etching.

According to one embodiment, the layer containing SiN is made from a material comprising or consisting of one of the following materials: SiN, SiCN, SiCBN.

More generally, the layer containing SiN is made from a material comprising the species Si, N and optionally other species except for oxygen.

According to one embodiment, the implantation is carried out anisotropically, in at least one main direction (z) of implantation substantially perpendicular to the plane (xy) in which the layer containing SiN or a substrate on which the layer containing SiN is deposited extends.

According to one embodiment, the implantation of ions made from hydrogen or from helium is carried out using a plasma.

According to one embodiment, the implantation in the layer containing SiN is carried out through a mask, preferably comprising at least one pattern of resin.

According to one embodiment, a plurality of cycles are carried out, each comprising implantation in the layer containing SiN and removal of said at least one modified zone via selective etching of said at least one modified zone with respect to at least one non-modified portion of the layer containing SiN.

According to one embodiment, the steps of modification and of removal of the layer containing SiN are carried out in the same plasma reactor.

This allows the method to be simplified considerably is to increase the production rates.

According to one embodiment, the implantation of ions made from hydrogen (or helium) and the step of etching are carried out in an inductively coupled plasma (ICP) or a capacitively coupled plasma (CCP) or an immersion plasma.

According to one embodiment, the layer containing SiN covers at least one pattern having sides and the implantation of said ions is carried out anisotropically in a main direction (z) of implantation parallel to said sides.

According to one embodiment, the sides are substantially flat. According to one embodiment, the sides can be formed by spacers of the pattern.

According to one embodiment, the modification of the layer containing SiN is preferably carried out over a depth corresponding to the entire thickness of the layer containing SiN in the portions of the layer containing SiN not covering the sides and preferably perpendicular to the sides, in such a way that the removal of said at least one modified zone removes the entire layer containing SiN outside of the sides of the at least one pattern and leaves in place at least a portion of the layer containing SiN covering the sides of the at least one pattern.

According to one embodiment, the at least one pattern is or comprises a gate of a transistor located above a layer made of a semiconductor material. The step of modification is carried out in such a way as to implant the light ions over the entire thickness of the layer containing SiN outside of the sides of the gate and optionally over a portion of the thickness of the layer of silicon nitride located on sides of the gate. The steps of implantation and of removal of said at least one modified zone are carried out in such a way as to etch said at least one modified zone selectively with respect to the semiconductor material and the non-modified silicon nitride.

According to one embodiment, the steps of implantation and of removal of said at least one modified zone are carried out in such a way as to preserve, on the sides of the at least one pattern, non-modified zones forming gate spacers.

According to one embodiment, $0.2 \leq R'=A/\{B+C'\} \leq 2$ and preferably $0.5 \leq R'=A/\{B+C'\} \leq 1.5$. According to one embodiment, $0.75 \leq R'=A/\{B+C'\} \leq 1.25$, and advantageously $0.9 \leq R'=A/\{B+C'\} \leq 1.1$, with:

A=flow rate of O2 or of N2 or of O2+N2.
B=flow rate of the at least one compound chosen from the fluorocarbon compounds ($C_xF_z$) and the hydrofluorocarbon compounds ($C_xH_yF_z$),
C'=flow rate of the at least one compound chosen from $Si_wCl(2_w+2)$ and preferably=SiCl4.

According to one embodiment, the at least one compound chosen from $Si_wCl(2_w+2)$ is SiCl4. This compound provides particularly high etching selectivity.

According to one embodiment,
before the steps of modification of the layer containing SiN and removal of the at least one modified zone (710), the following step is carried out:
a step of providing a substrate above which there is at least one first gate pattern and at least one second gate pattern, the layer containing SiN covering the first and second gate pattern, said patterns having sides;
the implantation of the light ions is carried out in such a way as to form modified zones of the layer containing SiN outside of the sides and preserve at least a portion of the thickness of the layer containing SiN on said sides, said portions defining non-modified zones;
after the step of modification of the layer containing SiN and before the step of removal of the at least one modified zone, the following steps are carried out:
masking of the first gate pattern with a masking layer;

removal of the modified zones of the layer containing SiN located on the second gate pattern selectively with respect to the non-modified zones located on the second gate pattern;

removal of the masking layer in such a way as to expose the layer containing SiN located on the first gate pattern.

According to one embodiment, the first gate pattern is a first gate stack of an n-type or p-type transistor and the second gate pattern is a second gate stack of a transistor of a type different than the type of the first gate stack.

The present invention has the advantage of proposing a simple and efficient solution for integrating, in a reproducible and simple manner and on the same substrate, transistors having different characteristics, for example n-type transistors and p-type transistors.

According to one embodiment, there is a plurality of first gate patterns and a plurality of second gate patterns above the substrate, one out of the plurality of first gate patterns and the plurality of second gate patterns comprises at least a first type of gate stack and a second type of gate stack each of the first and second types of gate stack comprising at least one insulating layer, typically a gate oxide. The thickness of the insulating layer of the first type of gate stack differs from the thickness of the insulating layer of the second type of gate stack.

Thus, on the same elaborate substrate, transistors of a first type having a characteristic different than that of a second type of transistor can be made. For example, on the same substrate, transistors of a first type having a first thickness of gate oxide and transistors of a second type having a second thickness of gate oxide greater than the first thickness in order to operate at greater voltages can be manufactured.

In order to limit the complexity of the method, numerous steps are common to the manufacturing of both types of transistors, in particular the creation of the metal layer, the gate made of polysilicon, the spacers, the sources and the drains.

The present invention has the advantage of proposing a simple and efficient solution for integrating, in a reproducible and simple manner and on the same substrate, transistors having different characteristics, for example gate oxides having different thicknesses.

According to one embodiment, the thickness of said insulating layer of the first stack is between 0 and 3 nm ($10^{-9}$ meters) and preferably between 0 and 1.5 nm.

According to one embodiment, the thickness of said insulating layer of the second stack is between 1.5 and 8 nm, preferably between 2 and 6 nm and preferably between 2 and 3.5 nm.

According to one embodiment, the first gate pattern is a sacrificial pattern. The second pattern is a sacrificial pattern. The method comprises, after said step of removal of the modified zones of the layer of nitride, a step of replacement of the first and second sacrificial pattern with patterns forming, respectively, a first gate stack and a second gate stack.

According to one embodiment, each of the first and second gate stack comprises at least one insulating layer, typically a gate oxide.

A first embodiment of the present invention will be described in reference to FIGS. 1a to 1d. All the features, steps and advantages described in reference to these FIGS. 1a to 1d apply to all the other embodiments of the invention and in particular to those described in the other drawings.

FIG. 1a illustrates a first step that involves providing a stack of layers comprising at least one substrate 100 above which there is a layer containing silicon nitride 700.

The substrate 100 can be a bulk single-layer substrate as illustrated in FIG. 1. Alternatively, the substrate 100 can be formed by a plurality of superimposed layers as illustrated in the examples of FIGS. 2a and 2b and 3a to 3h. The substrate 100, at its interface with the layer containing silicon nitride, is for example made from a semiconductor material preferably chosen from silicon (Si), germanium (Ge) and an alloy of silicon and germanium (SiGe). Alternatively, the substrate 100, at this interface, is made from an insulating material such as silicon oxide (SiOx, x being an integer).

The layer containing silicon nitride 700 is made from a material comprising or consisting of one of the following materials: SiN, SiCN, SiCBN. More generally, the layer 700 containing SiN is made from a material comprising the species Si, N and optionally other species except for oxygen.

This layer is for example formed at a deposition temperature greater than or equal to 450° C. preferably greater than or equal to 550° C.

The etching of the layer 700 containing SiN comprises the following main steps:

modification of the layer 700 containing silicon nitride in such a way as to form at least one modified zone 710. The modification comprises at least one implantation 1000 of light ions in the layer 700 containing silicon nitride.

The removal of the at least one modified zone 710 via etching of the at least one modified zone 710 using a chemistry comprising at least:

at least one compound chosen from the fluorocarbon compounds ($C_xF_z$) and the hydrofluorocarbon compounds ($C_xH_yF_z$), and at least one compound chosen from $Si_wCl(2_w+2)$ and $SiwF(2_w+2)$, x, y, z and w being integers. Preferably, w=1 or w=2.

Figure 4:
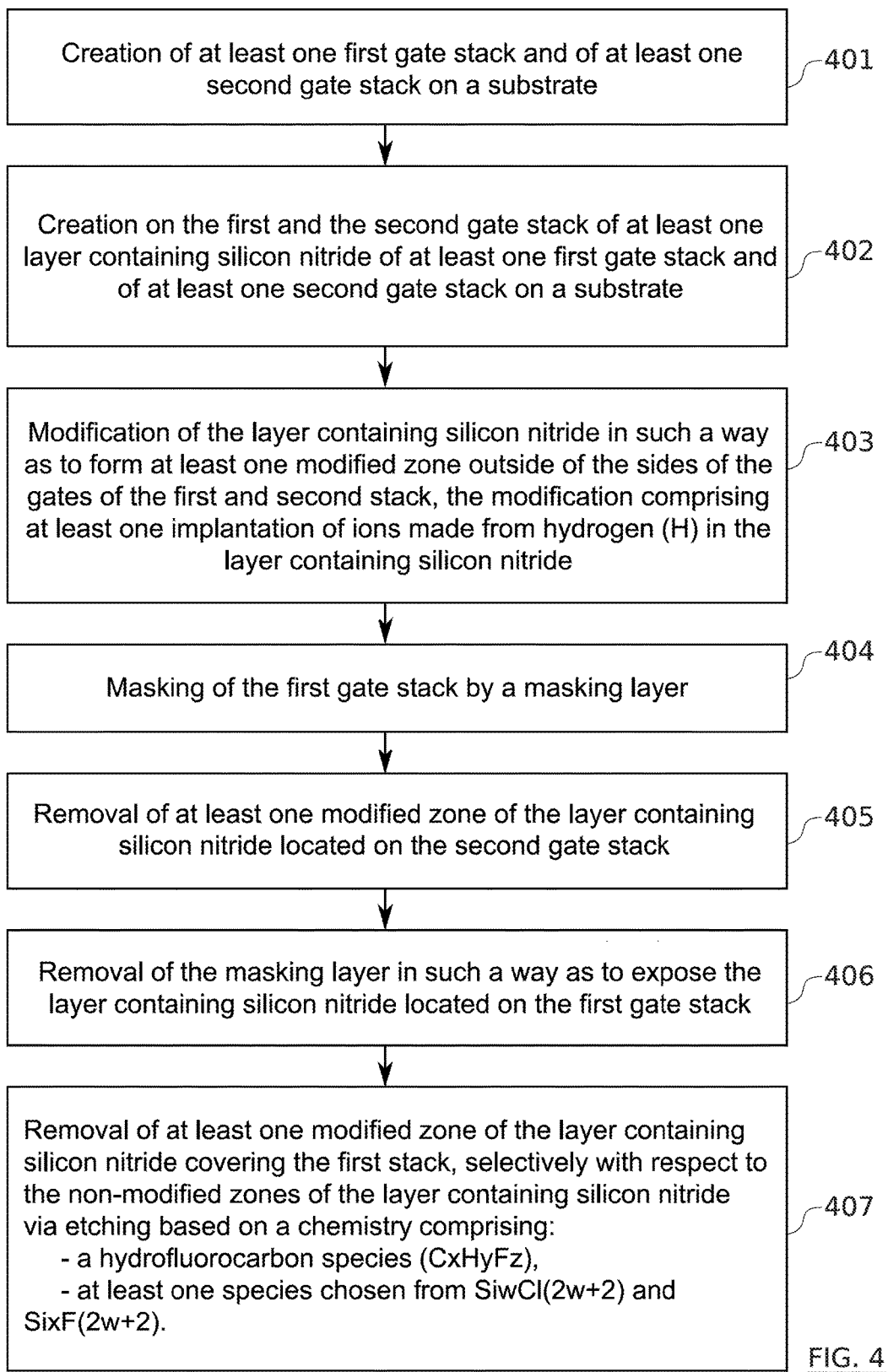
FIG. 4 summarises certain steps of the embodiment illustrated in FIGS. 3a to 3h.

As clearly illustrated in FIG. 4, the step of modification via implantation is carried out before the step of removal of the at least one modified zone of the layer containing silicon nitride. These steps are thus carried out successively.

Preferably, the modification via implantation and the removal of the layer 700 are carried out in the same reactor.

These steps will be explained in detail in reference to FIGS. 1b to 1d.

Modification via Implantation

FIG. 1b illustrates a step of modification of at least a portion of the layer containing nitride 700. This modification involves implanting light ions in the layer containing nitride 700. The light ions are preferably chosen from the following ions: H, $H^+$, $H_2^+$, $H_3^+$, $He^+$.

The ions made from hydrogen come for example from a plasma of H2. This gas allows the risks of sputtering of the layer containing nitride 700 to be prevented. Alternatively, the ions made from hydrogen can come from the following gases $H_2$, $NH_3$, HBr, or from a mixture of a gas containing H with an inert gas, for example Ar or He. However, in the latter case, the risks of physical sputtering of the layer 700 are greater.

Preferably, the implantation 1000 is carried out in such a way as to modify the structure of the layer containing silicon nitride 700 in the implanted zones without leading to sputtering of this layer.

Advantageously, the implantation 1000 is carried out in such a way that the ions implanted are distributed in an uninterrupted manner from the surface of the layer 700 containing silicon nitride and up to a desired depth. This distribution does not have any discontinuities. There are therefore no layers from which the implanted species are absent between the surface of the layer 700 containing silicon nitride and the maximum implantation depth. This distribution can be homogenous or non-homogenous. Typically, this distribution decreases from the surface of the layer 700 containing silicon nitride and up to said depth.

According to a particularly advantageous embodiment, the implantation 1000 is carried out using a plasma.

The implantation 1000 via plasma has the advantage of allowing an implantation 1000 in a continuous manner in a volume extending from the surface of the implanted layer.

Moreover, the use of a plasma allows an implantation 1000 at lower depths than the minimum depths that can be obtained with implanters. Thus, an implantation 1000 via plasma allows the efficient implantation, in a relatively homogenous manner or at the very least in a continuous manner, of fine thicknesses that can then be removed via selective etching. This continuity of implantation 1000 from the implanted face allows the homogeneity of the modification in the depth direction to be improved, which leads to an etching rate of the implanted layer that is constant over time. Moreover, the increase in the selectivity provided by the implantation 1000 with respect to the other layers is effective from the beginning of the etching of the implanted layer. The implantation 1000 via plasma thus allows significantly improved control of the etching precision.

The implantation 1000 of a plasma typically allows thicknesses extending from the surface of the implanted layer and over a depth from 0 nm to 100 nm to be implanted and then removed. Conventional implanters, allow an implantation 1000 in a volume comprised between 30 nm and several hundred nanometres. However, conventional implanters do not allow the species to be implanted between the surface of the layer to be implanted and a depth of 30 nm.

The use of a plasma to modify the layer to be removed is therefore particularly advantageous when a fine thickness, typically between 1 and 10 nm and more generally between 1 and 30 nm, must be removed.

The step of modification carried out using a plasma modifies the layer 700 containing silicon nitride in a continuous manner from the surface of this layer and over a thickness between 1 nm and 30 nm and preferably between 1 nm and 10 nm.

According to a particularly advantageous embodiment, the implantation 1000 and the removal of the layer 700 containing silicon nitride (a step that will be described in detail below) are carried out in the same plasma reactor. A modification of the layer to be removed carried out via an implantation 1000 via plasma thus allows the modification of the layer and the etching to be carried out in the same chamber which is very advantageous in terms of simplification, time and cost of the method.

Advantageously, this implantation 1000 of ions does not etch the material that does not lead to redeposition of the material on the sides of the patterns or on the walls of the reactor allowing better control of the critical dimensions of the etched patterns to be obtained and an independence of the etching with respect to the conditioning of the walls of the reactor to be obtained.

Advantageously, precisely obtaining a desired implantation depth, via control of the energy of the ions and of their dose, does not lead to the formation of a reactive layer like in the standard methods of plasma etching thus avoiding numerous disadvantages.

Advantageously, the implantation parameters, in particular the energy imparted on the ions, the duration and the dose of implantation 1000 are chosen in such a way that the zones 710 modified by implantations can be etched selectively with respect to the at least one underlying layer. These parameters are also adjusted in such a way that the modified zones 710 can be etched selectively with respect to the non-modified zones of the layer 700 containing silicon nitride.

Advantageously, the ions are chosen in such a way that the modified zones 710 can be etched selectively with respect to the layer(s) that are under them.

According to one embodiment, the implantation 1000 is carried out anisotropically, in at least one direction of implantation 1000 substantially perpendicular to the plane in which the layer 700 containing silicon nitride or the substrate 100 extends.

According to one embodiment, the layer 700 containing silicon nitride is carried out over a depth corresponding to the entire thickness of the layer 700 containing silicon nitride, in such a way that the removal of the modified zone 710 removes all of the layer 700 containing silicon nitride. It is this example that is illustrated in FIG. 1b.

According to another embodiment, the modification of the layer 700 containing silicon nitride is carried out over a depth corresponding to only a portion of the thickness of the layer 700 containing silicon nitride, in such a way that the removal of the modified zone 710 removes only a portion of the thickness of the layer 700 containing silicon nitride.

The step of modification of the layer 700 comprises for example the formation of a plasma comprising light ions. The target to be etched, that is to say, the layer 700 above the substrate 100, is placed in the plasma and is bombarded by the ions that are produced therein. A plurality of options for the formation of the plasma are possible:

A standard plasma etching chamber, in which it is possible to control the energy applied to the ions, is used. A low-density RIE plasma is thus created, RIE being an acronym for "reactive ion etching." A high-density plasma can also be formed in an ICP etcher, ICP being an acronym for "Inductive Coupled Plasma," a piece of equipment in which the radio-frequency field intended to form the plasma is produced by an antenna external to the chamber. The modification of the layer 700 can also be obtained using a very-high-density plasma obtained in a piece of ECR equipment, ECR being an acronym for "Electronic Cyclotronic Resonance." In this type of equipment, the plasma is produced by superimposing a static magnetic field and a high-frequency electromagnetic field at the resonance frequency of the cyclotron or circular movement of electrons that is produced.

Another option involves using a plasma called immersion plasma of the "capacitive coupling" or CCP type, CCP being an acronym for "Capacitive Coupled Plasma," in which a continuous voltage or high pulsed voltage is applied between two electrodes. The target to be implanted is placed on one of the electrodes, generally the cathode, and is therefore negatively polarised. This type of implantation is particularly efficient.

Alternatively, a direct implantation 1000 of the ions is carried out, without the target being placed in a plasma. A plurality of options are possible:

IBE equipment is used, IBE being an acronym for "ion beam etch," in which, conventionally, an energy sufficient to etch the bombarded material via sputtering is transmitted to a beam of ions. In the context of the invention, the bombardment is thus used to modify the layer 700 without etching it. There are alternatives of this equipment in which etching called RIBE is carried out, that is to say, reactive ion-etching that is similar, except that reactive ions are incorporated into the etching ion beam. In another alternative known by the name of chemically assisted ion beam etching (CAIBE), the reactive species are introduced into the process independently of the ion beam.

A standard implanter of the type used to implant doping species in a semiconductor material can also be used.

The implantation 1000 can be carried out on the whole plate and without a mask as illustrated in FIG. 1b.

Alternatively, this implantation 1000 can be carried out through a mask in order for only certain zones of the layer containing silicon nitride 700 to be implanted. The implantation 1000 is thus carried out in a preferred direction that is perpendicular to the plane in which the mask extends. Preferably, the mask is a hard mask. The mask has openings defining patterns. Preferably, the implantation 1000 is carried out on the whole plate, that is to say, in the openings of the mask and outside of these openings.

Removal of the Modified Zones

FIGS. 1c and 1d illustrate the step of selective removal of the at least one zone 710 modified by the implantation 1000.

For this removal, the at least one modified zone 710 is etched using a chemistry comprising:
- at least one compound chosen from the fluorocarbon compounds ($C_xF_z$) and the hydrofluorocarbon compounds ($C_xH_yF_z$), and
- at least one compound chosen from $Si_wCl(2_w+2)$ and $Si_wF(2_w+2)$, x, y, z and w being integers. Preferably, w=1 or w=2.

Optionally, cycles each comprising at least the step of implantation and the step of removal are repeated as many times as necessary in order to completely etch the layer 700, or reach the desired etching depth if the latter cannot be obtained in one go.

Preferably, the step of removal of the modified zones 710 of the layer 700 is carried out via dry etching in a plasma 2000 formed in a confined chamber using the species indicated above.

A second embodiment will now be described in reference to FIGS. 2a to 2b.

In this embodiment, the substrate 100 comprises a stack of layers. A pattern 200 is formed on the substrate 100. This pattern 200 is for example a transistor gate stack. Typically, this stack comprises at least successively starting from the substrate 100: an insulating layer forming a gate oxide, a gate 204 and a hard mask 205. The various layers forming such a pattern will be explained in detail in reference to FIG. 3a.

Before step 2a, a layer 700 containing silicon nitride is deposited on the pattern 200 and on the substrate 100. This deposition is conformal. The thickness of the layer 700 is therefore homogenous on the sides 210 of the pattern 200, on top of the pattern 200, and outside of the pattern 200.

Step 2a illustrates the modification of the layer 700 containing silicon nitride via the implantation 1000 of light ions. The implantation is anisotropic. The main direction of implantation 1000 is perpendicular to the main plane in which the substrate 100 extends is parallel to the sides 210 of the pattern 200.

Thus, as illustrated in FIG. 2b, the sides 210 of the pattern 200 are not modified or are modified over a thickness much smaller than the zones located outside of the pattern and on top of the pattern 200. The zones modified over a large thickness are labelled 710 and the zones that are not modified or modified over a smaller thickness are labelled 720.

FIG. 2b also illustrates the step of etching the modified zones 710 using a plasma 2000 comprising at least one fluorocarbon compound ($C_xF_z$) or hydrofluorocarbon compound ($C_xH_yF_z$) to which at least one compound chosen from $Si_wCl(2_w+2)$ and $Si_wF(2_w+2)$ is added.

After this etching step, the zones 710 are removed and the zones 720 are preserved. The latter thus form spacers on the sides 210 of the pattern 200.

According to this embodiment, the modification of the layer 700 containing silicon nitride is carried out over a depth corresponding to the entire thickness of the layer 700 containing silicon nitride taken in a direction perpendicular to the direction of the anisotropic implantation 1000, in such a way that the removal of the film removes all of the layer 700 containing silicon nitride outside of the sides of the patterns and leaves in place at least a portion of the layer 700 containing silicon nitride covering the sides of the patterns. The method according to the invention thus provides a reliable and very precise solution for forming spacers of a transistor gate.

Spacers made of silicon nitride, the thicknesses of which are controlled with precision, are thus obtained without degrading the underlying substrate 100.

In reference to FIGS. 3a to 3h and 4, a third embodiment of the invention will now be described.

FIG. 3a illustrates a structure starting from which the steps of the method according to the invention are carried out. This structure comprises transistors in the process of being formed.

This structure comprises:
- an elaborate semiconductor on insulator (SOI) substrate 100. In the example illustrated, this elaborate substrate successively comprises a supporting layer 101; for example made of monocrystalline, polycrystalline or amorphous silicon; an insulating layer 102, usually called buried oxide (BOX for "Buried Oxide") and an active semiconductor layer 103 intended to form a conductive channel of a transistor. The latter layer is for example made of silicon (Si), germanium (Ge) or silicon-germanium (SiGe), preferably monocrystalline.
- gate patterns 200a, 200b, 300a, 300b. As illustrated in FIGS. 3a to 3h, the semi conductor layer 103 is discontinuous in order to form disjointed portions, each portion being located under a pattern 200a, 200b, 300a, 300b. In the example illustrated, which is non-limiting, the gate patterns 200a, 200b, 300a, 300b each form a stack of a plurality of layers. These patterns 200a, 200b, 300a, 300b are intended to be preserved in the final transistors (gate first method). According to an alternative embodiment that is not illustrated, the gate patterns 200a, 200b, 300a, 300b are sacrificial patterns that are intended to be removed after the creation of the spacers and then be replaced by another gate preferably forming a stack (gate last method). The invention covers this alternative embodiment.

In the rest of the description, which illustrates a gate first embodiment in reference to the drawings, both the terms stack and pattern will be used.

Typically and like for the embodiment of FIGS. 2a to 2b, the gate stacks each comprise at least one gate 204a, 204b, 304a, 304b usually made of polycrystalline silicon or metal and an insulating layer usually called gate oxide 201a, 201b, 301a, 301b located under the gate and through which an electric field will be able to develop in order to create an underlying conductive channel between source and drain when a sufficient voltage is applied to the gate 204a, 204b, 304a, 304b.

Preferably, the gate stack also comprises:
- a metal layer often called metal gate 203a, 203b, 303a, 303b and located between the gate 204a, 204b, 304a, 304b and the gate oxide 201a, 201b, 301a, 301b;
- a dielectric layer 202a, 202b, 302a, 302b, called "high-k", that is to say, made from a material having high permittivity. This layer is located between the gate oxide 201a, 201b, 301a, 301b and the metal gate 203a, 203b, 303a, 303b.
- a protective hard mask 205a, 205b, 305a, 305b that will be removed later in order to allow contact on the gate 204a, 204b, 304a, 304b. This hard mask 205a, 205b, 305a, 305b, which remains in place after etching of the gate 204a, 204b, 304a, 304b, is typically made from SiO2 or silicon nitride (SiN). Its role is to protect the top of the gate 204a, 204b, 304a, 304b from any damage while the following steps are carried out, in particular those of etching the spacers. A fine layer of oxide can be found between the polycrystalline silicon of the gate and the nitride hard mask.

Preferably, the insulating layer of gate oxide 201a, 201b, 301a, 301b is deposited in contact with the active layer 103 forming the conductive channel and in contact with the layer having high permittivity 202a, 202b, 302a, 302b. Preferably, the metal layer 203a, 203b, 303a, 303b is deposited in contact with the layer having high permittivity 202a, 202b, 302a, 302b and in contact with the gate 204a, 204b, 304a, 304b. According to another embodiment, the metal layer 203a, 203b, 303a, 303b and/or the layer having high permittivity 202a, 202b, 302a, 302b are not present. According to another embodiment, the hard mask 205a, 205b, 305a, 305b is formed from silicon nitride (SiN).

The same elaborate substrate 100 supports a plurality of transistors and thus of gate stacks. For certain uses, it is necessary to have transistors having different properties. Thus, certain transistors are p-type (200a, 200b) and others are n-type (300a, 300b). Moreover, certain transistors must have a gate oxide 201a, 301a having a thickness that is greater than that of the gate oxide 201b, 301b of other transistors.

As a non-limiting example, on the same elaborate substrate 100, there can be:
- transistors, the gate oxide of which has a thickness between 0 and 1.5 nm. These transistors are known to operate at a voltage Vdd between 0.8V and 1V. These transistors are sometimes called SG or GO1.
  The thickness of the spacers is measured perpendicularly to the plane containing the sides of the gates, i.e. in this example, in a direction parallel to the main plane in which the substrate 100 extends. This thickness is thus measured horizontally in the drawings.
- transistors, the gate oxide of which has a thickness between 2 and 5 nm, and more often between 2 and 3.5 nm. These transistors are known to operate at a voltage Vdd between 1.5V and 3.5V. Thus, the breakdown voltage for these transistors is greater than the maximum voltage applied to the gate oxide. These transistors are sometimes called EG or GO2.
- transistors, the gate oxide of which has a thickness between 3 and 6 nm, are known to operate at a voltage Vdd greater than 3V. Thus, the breakdown voltage for these transistors is greater than the maximum voltage applied to the gate oxide. These transistors are sometimes called ZG or GO3.

The structure illustrated in FIG. 3a also shows the presence of an isolation trench 104 passing through the entire active layer 103 in order to isolate two adjacent transistors. These isolation trenches 104 extend through the entire thickness of the active layer 103 and into the supporting layer 101. These isolation trenches are typically made from an oxide, for example SiO2.

The structure illustrated in FIG. 3a also shows the presence of at least one protective layer 400 intended to form spacers 206a, 206b on the sides of the gates 204a, 204b, 304a, 304b. In the example illustrated, there is only one protective layer 400. According to an alternative embodiment, there is a plurality of protection layers 400.

As illustrated in FIG. 3a, this protective layer 400 is deposited conformally on the stacks 200a, 200b, 300a, 300b. This protective layer 400 has for example a thickness between 3 and 10 nm without this being limiting and preferably of approximately 4 to 8 nm. It is for example made from a material having a low dielectric constant (k less than 7) such as SiCBN. It is preferably deposited at a temperature greater than or equal to 550° C.

Alternatively, this protective layer 400 can be made from one of the following materials: SiN, SiCO and SiOCN.

In general, this protective layer 400 is formed from a material having a low dielectric constant, more precisely a material having a dielectric constant k that is less than 7.

Figure 3B:
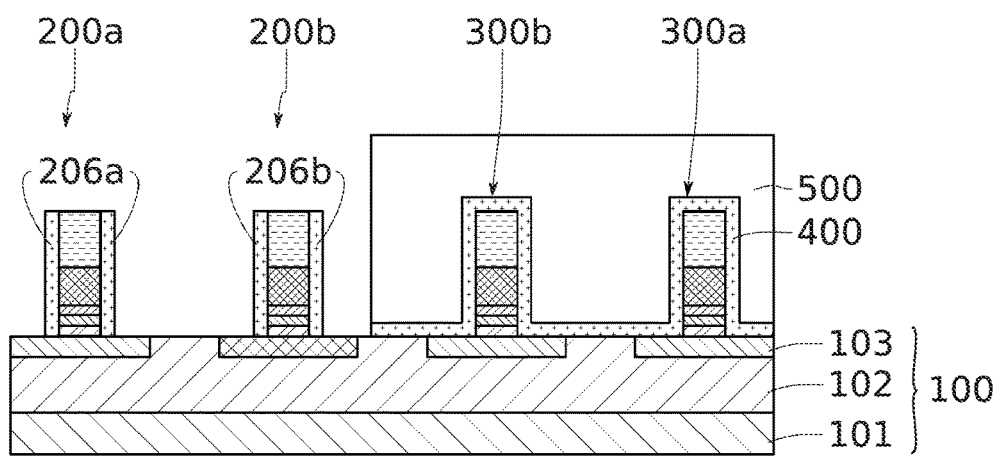

FIG. 3b illustrates a following step during which a masking layer 500 is formed in order to entirely cover the second gate stacks 300a, 300b, that is to say, in this case the stacks intended to form n-type transistors. The stacks 200a, 200b intended to form p-type transistors are not covered by the masking layer 500. According to an alternative adjustment mode, the stacks 200a, 200b intended to form p-type transistors are masked during this step and the stacks 300a, 300b intended to form n-type transistors are not covered.

This masking layer 500 is typically a layer of resin, deposited on the whole plate, then opened at the second stacks 300a, 300b by one of the conventional lithography techniques.

The following step, also illustrated in FIG. 3b, is aimed at preserving the protective layer 400 that covers the sides of the first stacks 200a, 200b and removing this layer 400 outside of the first gate stacks 200a, 200b. On the sides of the first stacks 200a, 200b, the protective layer 400 thus forms spacers 206a, 206b.

Preferably, in order to carry out this anisotropic etching of the protective layer 400 selectively with respect to the layer of the gate stack 200a, 200b, the semi conductor layer 103 and the insulating layer 102, a plasma etching is carried out that reads a fluorocarbon chemistry. This type of chemistry broadly known to a person skilled in the art. A chemistry based on CH3F/O2/He can for example be used.

This is therefore anisotropic etching carried out in a preferred direction z that is perpendicular to the main plane xy in which the substrate 100 extends.

Figure 3C:
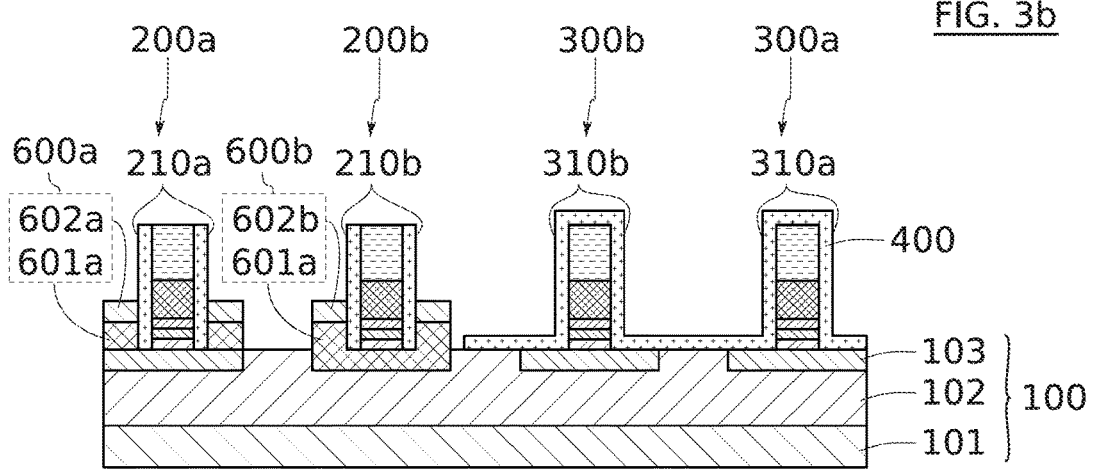

FIGS. 3a to 3c correspond to step 401 in FIG. 4.

Preferably, the anisotropic etching consumes all of the protective layer 400 on the top of the first stacks 200a, 200b and between the latter.

Moreover, the second stacks 300a, 300b, that is to say, the n-type zones, are protected by the masking layer 500 and remain in place.

As illustrated in FIG. 3c, the masking layer 500 is then removed. Naturally, this removal is selective for the material of the protective layer 400 in order to preserve the latter on the first stack 200a, 200b. When this masking layer 500 is a photosensitive resin, it is for example removed in a capacitively coupled, inductively coupled or microwave reactor by using an oxidising or reducing chemistry. For example, a gaseous mixture of N2 and H2 can be injected into a plasma reactor for the etching, and then a wet cleaning can be carried out in order to remove the residues of resin. This cleaning can be carried out using an SC1 solution.

FIG. 3c also illustrates at least one step of epitaxy carried out using the semi conductor layer 103 located under the first stacks 200a and 200b. For example, during this step of epitaxy, the following are successively grown:
- on either side of the stack 200a and using the layer 103 made from silicon: zones of silicon-germanium 601a and then zones of silicon 602a.
- on either side of the stack 200b and using the layer 103 made of silicon-germanium: zones of silicon-germanium 601b and then zones of silicon 602b.

If the first stacks 200a, 200b are p-type, the materials that are grown via epitaxy are for example doped with boron.

These zones formed by epitaxy are intended to form sources and a drain 600a, 600b for the stacks 200a and 200b. These zones are partly in contact with the sides 210a, 210b formed by the spacers 206a, 206b of the stacks 200a, 200b.

The portions of conductive materials located under the second stacks 300a, 300b are not subject to growth via epitaxy because these portions are protected by the protective layer 400 that has not been etched during the previous step.

Figure 3D:
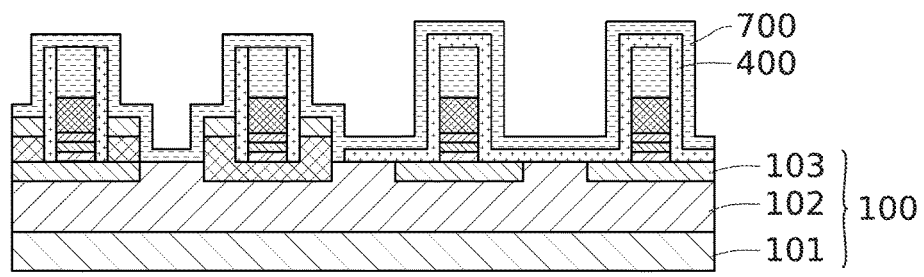

FIG. 3d corresponds to step 402 in FIG. 4 and illustrates a step of depositing the layer 700 containing silicon nitride. This deposition is conformal. Thus, the layer 700 covers each of the stacks 200a, 200b, 300a, 300b and their possible sources and drains 600a, 600b. This layer 700 is for example deposited via a PEALD method (plasma-enhanced atomic layer deposition). According to a non-limiting embodiment, this layer 700 is deposited at a temperature greater than or equal to 550° C.

Figure 3E:
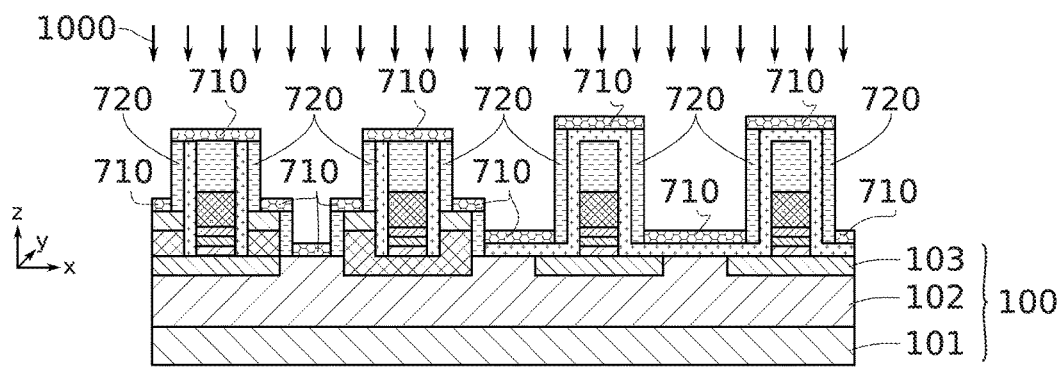

FIG. 3e illustrates the step of anisotropic modification of the layer 700 and corresponds to step 403 in FIG. 4. The modification is carried out via implantation 1000 of hydrogen ions in a main direction z parallel to the main plane xy in which the substrate 100 extends.

Figure 3F:
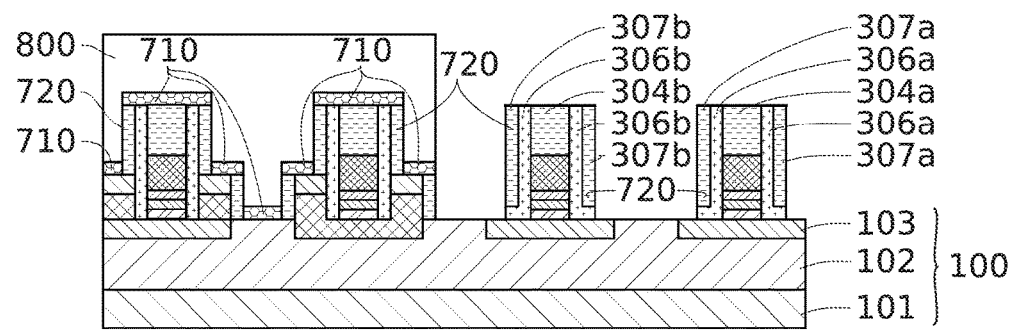
Figure 3G:
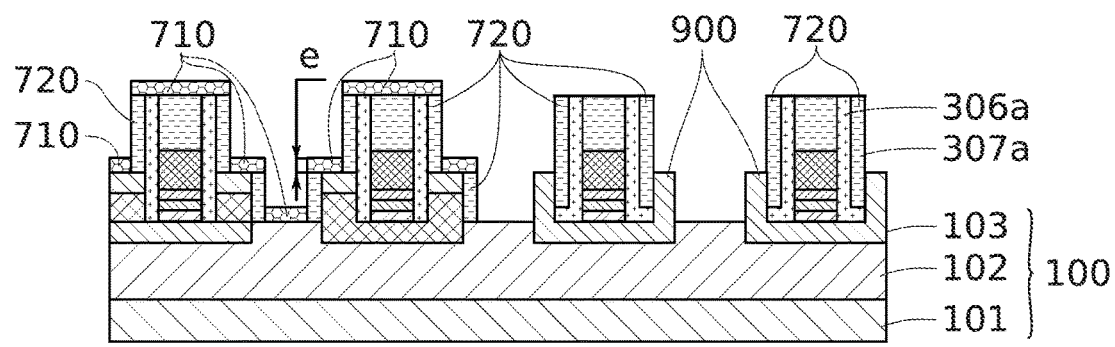

The depth of implantation corresponds to the reference e2 illustrated in FIG. 3g. Thus, the direction of the implantation is parallel to the sides of the patterns if the latter are perpendicular to said plane xy. Examples of implantation and of equipment for carrying out this implantation 1000, in particular via plasma, were described above.

The implantation parameters, in particular the energy imparted on the ions, the duration and the dose of implantation are chosen in such a way that:
- the modified zones 710 of the layer 700 are located on the top of the patterns and between the patterns 200a, 200b, 300a, 300b. In these zones, preferably the entire thickness of the layer 700 is modified. In these modified zones 710, the material of the layer 700 is thus enriched with hydrogen ions.
- there remain non-modified zones 720 on the sides of the patterns 200a, 200b, 300a, 300b. In the example illustrated, the sides of the patterns are formed by the protective layer 400. Preferably, the entire thickness of the layer 700 is free of implantation. According to an alternative embodiment, only a portion of the thickness of the layer 700 is implanted.

FIG. 3f illustrates a following step during which a masking layer 800 is formed in order to entirely cover the first gate stacks 200a, 200b, that is to say, in this case, the stacks intended to form p-type transistors. The stacks 300a, 300b intended to form n-type transistors are not covered by the masking layer 800. According to an alternative embodiment, the stacks 300a, 300b intended to form n-type transistors are masked during this step and the stacks 200a, 200b intended to form p-type transistors are not covered.

This masking layer 800 is typically a layer of resin, deposited on the whole plate, then opened at the first stacks 200a, 200b by one of the conventional lithography techniques.

The deposition of this masking layer corresponds to step 404 in FIG. 4.

The following step, also illustrated in FIG. 3f, is aimed at preserving the layer 700 containing silicon nitride and the protective layer 400 on the sides of the second stacks 300a, 300b and removing these layers 700, 400 outside of the sides of the second stacks 300a, 300b. On the sides of the second stacks 300a, 300b, the layer 700 thus forms spacers 307a, 307b that are superimposed on the spacers 306a, 306b formed by the protective layer 400.

Preferably, in order to carry out this anisotropic etching of the layers 700 and 400, a plasma etching well known to a person skilled in the art is carried out. A fluorocarbon chemistry can for example be used.

This is therefore anisotropic etching of the modified portions 710 with respect to the non-modified portions 720 of the layer 700 containing silicon nitride.

Preferably, the anisotropic etching removes the entire thickness of the layers 700 and 400 on the top of the stacks 300a, 300b. On the side of the patterns 300a, 300b, the protective layer 400 remains protected by the spacers 307a and 307b.

Preferably, the anisotropic etching does not remove or only removes a portion of the thickness of the layer 700 on the side of the patterns 300a, 300b.

On the side of the patterns 300a, 300b, the protective layer 400 remains protected by the spacers 307a and 307b.

Moreover, during the etching of the layer 700 containing silicon nitride and of the protective layer 400, the first stacks 200a, 200b, that is to say, the p-type zones, remain protected by the masking layer 800.

According to this preferred embodiment, a single etching step allows the layer 700 and the layer 400 to be removed outside of the sides of the second patterns 300a, 300b, which allows the production rates to be increased. According to an alternative embodiment, two different etchings are used to etch the layer 700 and then the layer 400.

This step of selective etching corresponds to step 405 in FIG. 4.

As illustrated in FIG. 3g, the masking layer 800 is then removed. When this masking layer 800 is a photosensitive resin, the techniques mentioned above for removing the masking layer 500 illustrated in FIG. 3c can be used. This FIG. 3g corresponds to step 406 in FIG. 4.

FIG. 3g also illustrates at least one step of epitaxy carried out using the semi conductor layer 103 located under the second stacks 300a and 300b. For example, during this step of epitaxy, the following are grown successively on either side of the stacks 300a, 300b and using the layer 103 made of silicon: zones of silicon.

In this example, in which the first stacks 200a, 200b are p-type, the epitaxy is carried out in such a way that the silicon grown via epitaxy is doped with phosphorus.

These zones formed via epitaxy are intended to form sources and a drain 900 for the stacks 300a and 300b. These zones are partly in contact with the sides formed by the spacers 307a, 307b of the stacks 300a, 300b.

Figure 3H:
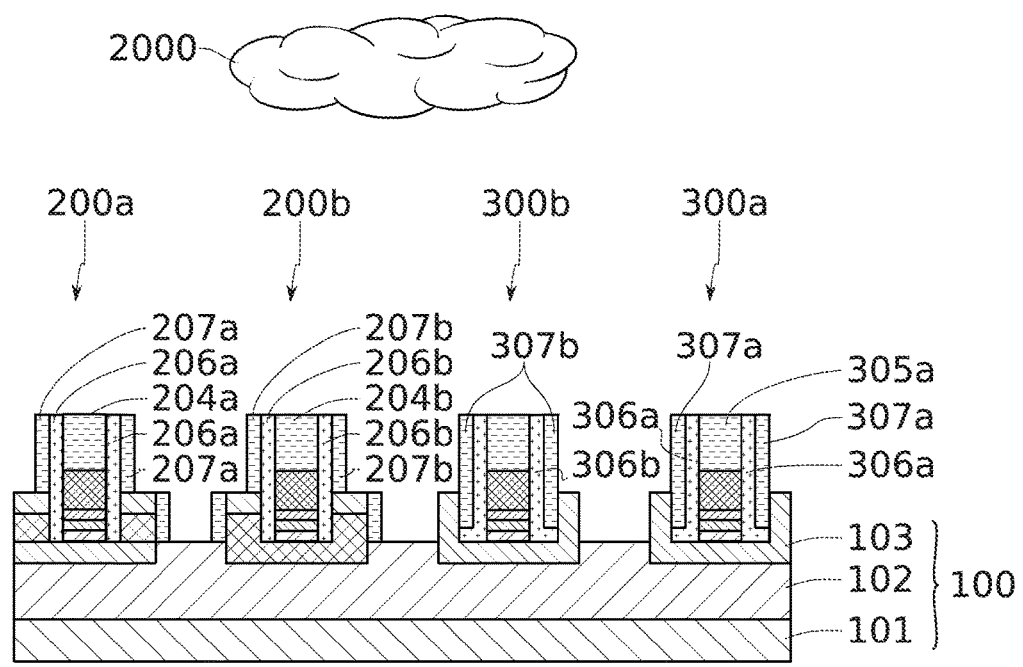

The following step, illustrated in FIG. 3h, is aimed at removing the modified zones 710 of the layer containing silicon nitride while preserving the non-modified zones 720 on the sides of the first patterns 200a, 200b and of the second patterns 300a, 300b. The non-modified zones 720 on the sides of the first patterns 200a, 200b thus form conventional spaces 207a, 207b.

With the conventional methods, this step would be particularly difficult since the layer containing silicon nitride would have to be etched while limiting the consumption of the semiconductor layer 103, of the sources and drain 900 and of the insulating layer 102 during this etching.

In the context of the invention, the removal of the layer containing silicon nitride 700 outside of the sides of the first patterns 200a, 200b is carried out via plasma etching 2000 using a chemistry comprising at least:
- a compound chosen from the fluorocarbons ($C_xF_z$) and the hydrofluorocarbons ($C_xH_yF_z$), and
- at least one compound chosen from $Si_wCl(2_w+2)$ and $Si_wF(2_w+2)$, preferably with w=1 or w=2.

As indicated above, this etching allows the modified zones 710 containing silicon nitride to be removed quickly with very high selectivity with respect to the semi conductor layer 103 made for example from silicon and the insulating layer 102 made for example from silicon oxide. Consequently, these two latter layers 102, 103 are not altered and the performance of the transistor is improved.

Moreover, this etching allows the modified zones 710 to be removed with a very high selectivity with respect to the non-modified zones 720. The invention thus allows improved dimensional control.

The thickness etched is illustrated by the reference e in FIG. 3g. Thus, all the modified zones 710 located on the top of the first patterns 200a, 200b are removed. However, there is no consumption of the spacers 307a, 307b and optionally of the spacers 306a, 306b since the etching is selective for the implanted zones with respect to the non-implanted zones.

This step of selective etching corresponds to step 407 illustrated in FIG. 4.

Advantageously, during this step of removal, the chemistry of the plasma etching 2000 also comprises oxygen or nitrogen. Preferably, O2 or a gas comprising N2 is injected into the plasma reactor. This allows the polymerisation to be limited.

For example, O2 is injected with the following ratio R:
R=A/{B+C}<0.23 and preferably A/{B+C}≤0.2, with
A=flow rate of O2, of N2 or of O2+N2.
B=flow rate of the at least one compound chosen from the fluorocarbon compounds ($C_xF_z$) and the hydrofluorocarbon compounds ($C_xH_yF_z$),
C=flow rate of the at least one compound chosen from $Si_wF(2_w+2)$.
Preferably, 0.1≤R
According to one embodiment, 0.1≤R≤0.23
If the concentration of oxygen is too low, the etching can stop via the formation of a fluorocarbon polymer. Conversely, if the concentration of oxygen is too high, the etching also stops, this time due to oxidation of the material. Likewise, 0.2≤R'=A/B+C')≤2 and preferably 0.5≤R'=A/B+C')≤1.5. According to one embodiment, 0.75≤R'=A/{B+C'}≤1.25, and advantageously 0.9≤R'=A/{B+C'}≤1.1, with:
A=flow rate of O2 or of N2 or of O2+N2.
B=flow rate of the at least one compound chosen from the fluorocarbon compounds ($C_xF_z$) and the hydrofluorocarbon compounds ($C_xH_yF_z$),
C'=flow rate of the at least one compound chosen from $Si_wCl(2_w+2)$ and preferably=SiCl4.
In the case of the SiCl4 chemistry, a ratio R'=flow rate O2/(SiCL4+FC)=1 performs particularly well.

Specific and Non-Limiting Examples of the Present Invention

Detailed examples of embodiments will now be described. The numerical values indicated below possibly apply to all the embodiments covered by the claims and in particular to all the embodiments described in reference to the drawings. The numerical values indicated below are not therefore limiting.

Examples of plasma density and energies that can be imparted onto the implanted species are summarised in the following table:

TABLE 1

| | Type of plasma | | |
|---|---|---|---|
| | CCP | ICP | Immersion |
| Density (atoms/cm³): | $10^9$-$10^{10}$ | $10^{10}$-$10^{12}$ | =or > $10^{13}$ |
| Energy of the ions (eV) | 10-1000 and preferably 200-500 | 1-1000 and preferably 15-1000 | up to 25 × $10^3$ |
| Pressure ($10^{-3}$ Torr) | 10-1000 | 1-10 | |

1. Modification of the Layer Containing Nitride 700

In order to modify a layer containing nitride 700, the following parameters can for example be applied, in particular for an ICP plasma. These parameters give particularly good results for a layer containing nitride 700 having a thickness between 5 and 20 nm and typically of 10 nm, this layer 700 having been formed via PEALD conformal deposition (plasma-enhanced atomic layer deposition) at a temperature greater than 500° C.

TABLE 2

| | |
|---|---|
| Thickness modified: | from 1 nm to several tens of nm. Typically from 1 to 20 nm |
| Chemistry: | Gas containing Hydrogen, typically (H2) 10 to 500 sccm |
| Power of the source: | 0-2000 Watts |
| Power of the polarisation (bias): | 20 V to 500 V |
| Pressure: | 5 to 100 milli Torr |
| Temperature: | 10° C. to 100° C. |
| Time: | from several seconds to several hundred seconds |

The power of the polarisation and the power of the source can be pulsed or continuous.

The ranges of the tables above are broad and are dependent on the specific uses of the method of the invention and in particular on the thickness that is desired to be modified in the layer 700 containing silicon nitride.

For example, to modify a layer of silicon nitride 700 over a depth of 15 nm in a piece of ICP etching equipment, the following parameters can be applied:

TABLE 3

| | |
|---|---|
| Thickness modified: | 15 nm |
| Chemistry: | H2 at 50 sccm |
| Power of the source: | 200 Watts |
| Power of the polarisation (bias): | 350 V |
| Pressure: | 10 milli Torr |
| Temperature: | 10° C. to 100° C. |
| Time: | 60 seconds |

2. Removal of the at least one Modified Zone

In order to etch the modified zones 710 selectively with respect to the non-modified zones 720 of the layer containing nitride 700, the following parameters can for example be applied in particular for an ICP plasma.

TABLE 4

| Thickness modified: | from 1 nm to several tens of nm. Typically from 1 to 20 nm |
|---|---|
| Chemistry: | Fluorocarbon gas: CxHyFz (10 sccm to 500 sccm) diluted in the O2 (10 sccm to 1000 sccm) and Gas 2 SiCl4 or SiF4 (5 to 15 sccm) |
| Power of the source: | 100-1000 Watts |
| Power of the polarisation (bias): | 50 V to 500 V |
| Pressure: | 10 to 80 milli Torr |
| Temperature: | 10° C. to 100° C. |
| Time: | from several seconds to several tens of seconds |

The power of the polarisation and the power of the source can be continuous or pulsed.

In the latter case, a frequency between 200 Hz and 5 Khz with a duty cycle (time of activation of the plasma with respect to the period) between 20% to 100% can be used.

The ranges of the tables above are broad and are dependent on the specific uses of the method of the invention and in particular on the thickness that is desired to be etched in the layer 700 containing silicon nitride.

For example, to etch a layer of silicon nitride 700 that has been previously modified according to the parameters of table 3 above, the parameters of table 4 can be applied for a time of 30 seconds with an FC+SiCl4 chemistry. An average consumption of SiN of 6.7 nm is thus obtained.

The invention is not limited only to the embodiments and examples described above and extends to all the embodiments that fall within the scope of the claims.

The invention claimed is:

1. A method for etching a layer containing silicon nitride, comprising the following successive steps:
   modifying the layer containing silicon nitride (SiN) so as to form at least one modified zone, the modifying comprising at least one implantation of ions made from hydrogen (H) and/or helium (He) in the layer containing SiN; and
   removing the at least one modified zone, the removing comprising at least one step of plasma etching of the at least one modified zone using a chemistry comprising at least:
      one compound chosen from fluorocarbon compounds ($C_xF_z$) and hydrofluorocarbon compounds ($C_xH_yF_z$), and
      one compound chosen from $Si_wCl(2_w+2)$ and $Si_wF(2_w+2)$,
   where x, y, z, and w are integers.

2. The method according to claim 1, wherein the layer containing SiN is formed at a temperature greater than or equal to 500° C.

3. The method according to claim 1, wherein the layer containing SiN is on top of a layer made from a material chosen from:
   a semiconductor material, chosen from silicon (Si), germanium (Ge), and an alloy of silicon and of germanium (SiGe), and
   an oxide of silicon (SiOx), where x is an integer.

4. The method according to claim 1, wherein parameters of the at least one implantation, including energy, duration, and dose of the implantation, are chosen such that the at least one modified zone extends over a depth greater than or equal to a thickness of the layer containing SiN, the thickness being taken in a direction parallel to a main direction (z) of implantation.

5. The method according to claim 1, wherein said chemistry also comprises at least one compound chosen from oxygen or nitrogen.

6. The method according to claim 1, wherein the layer containing SiN is made from a material comprising one of the following materials: SiN, SiCN, and SiCBN.

7. The method according to claim 1, wherein the at least one implantation is performed anisotropically, in at least one main direction (z) of implantation substantially perpendicular to a plane (xy) in which the layer containing SiN or a substrate on which the layer containing SiN extends.

8. The method according to claim 1, wherein the at least one implantation of ions made from hydrogen is performed using a plasma.

9. The method according to claim 1, wherein the at least one implantation in the layer containing SiN is carried out through a mask.

10. The method according to claim 1, wherein the steps of modification and of removal of the layer containing SiN are performed in a same plasma reactor.

11. The method according to claim 1, wherein the layer containing SiN covers at least one pattern having sides and the at least one implantation of said ions is performed anisotropically in a main direction (z) of implantation parallel to said sides.

12. The method according to claim 11, wherein the modification of the layer containing SiN is performed such that the removal of said at least one modified zone removes all of the layer containing SiN outside of the sides of the at least one pattern and leaves in place at least a portion of the layer containing SiN covering the sides of the at least one pattern.

13. The method according to claim 11,
   wherein the at least one pattern forms or comprises a gate stack of a transistor located above a layer made of a semiconductor material,
   wherein the step of modification is performed so as to implant the ions over an the entire thickness of the layer containing SiN outside of the sides of the stack of the gate, and
   wherein the steps of implantation and of removal of said at least one modified zone are performed so as to etch said at least one modified zone selectively with respect to the semiconductor material at non-modified zones of the layer containing SiN.

14. The method according to claim 13, wherein the steps of implantation and of removal of said at least one modified zone are performed so as to preserve, on the sides of the at least one pattern, non-modified zones forming gate spacers.

15. The method according to claim 1,
   wherein, before the steps of modification of the layer containing SiN and removal of the at least one modified zone, the following step is performed:
      providing a substrate above which there is at least one first gate pattern and at least one second gate pattern, the layer containing SiN covering the first and second gate pattern, said patterns having sides,
   wherein the at least one implantation of said ions being performed so as to form modified zones of the layer containing SiN outside of the sides and to preserve at least a portion of the thickness of the layer containing SiN on said sides, said portions defining non-modified zones, and wherein, after the step of modification of the layer containing SiN and before the step of removal of the at least one modified zone, the following steps are performed:

masking of the first gate pattern with a masking layer, removal of the modified zones of the layer containing SiN located on the second gate pattern selectively with respect to the non-modified zones located on the second gate pattern, and removal of the masking layer in so as to expose the layer containing SiN located on the first gate pattern.

16. The method according to claim 15, wherein the first gate pattern is a first gate stack of an n-type or p-type transistor, and wherein the second gate pattern is a second gate stack of a transistor of a type different than the type of the first gate stack.

17. The method according to claim 16, wherein there is a plurality of first gate patterns and a plurality of second gate patterns above the substrate, one out of the plurality of first gate patterns and the plurality of second gate patterns comprises at least a first type of gate stack and a second type of gate stack each of the first and second types of gate stack comprising at least one insulating layer, and wherein a thickness of the insulating layer of the first type of gate stack differs from a thickness of the insulating layer of the second type of gate stack.

18. The method according to claim 16, wherein the first gate pattern is a sacrificial pattern, wherein the second pattern is a sacrificial pattern, and the method further comprising, after said step of removal of the modified zones of the layer of nitride, a step of replacement of the first and second sacrificial pattern with patterns forming, respectively, a first gate stack and a second gate stack.

* * * * *